(12) United States Patent
Kim

(10) Patent No.: US 12,438,009 B2
(45) Date of Patent: Oct. 7, 2025

(54) APPARATUS FOR MOUNTING SOLDER BALLS

(71) Applicant: Samsung Electronics Co., Ltd., Suwon-si (KR)

(72) Inventor: Young-Ja Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 18/061,229

(22) Filed: Dec. 2, 2022

(65) Prior Publication Data
US 2023/0187228 A1 Jun. 15, 2023

(30) Foreign Application Priority Data
Dec. 10, 2021 (KR) .......... 10-2021-0176261

(51) Int. Cl.
*H01L 21/67* (2006.01)
*B23K 3/06* (2006.01)
(Continued)

(52) U.S. Cl.
CPC ...... *H01L 21/67011* (2013.01); *B23K 3/0623* (2013.01); *H01L 21/4853* (2013.01); *H01L 21/6838* (2013.01); *H01L 23/49816* (2013.01); *H01L 23/49833* (2013.01); *H01L 24/05* (2013.01); *H01L 24/13* (2013.01); *H01L 24/16* (2013.01); *H01L 2224/05624* (2013.01); *H01L 2224/05647* (2013.01); *H01L 2224/13111* (2013.01); *H01L 2224/16227* (2013.01)

(58) Field of Classification Search
None
See application file for complete search history.

(56) References Cited

U.S. PATENT DOCUMENTS 6,051,273 A * 4/2000 Dalal ................ B23K 3/0623
427/124
6,186,389 B1 * 2/2001 Nakajima ............ H05K 3/3478
228/41

(Continued)

FOREIGN PATENT DOCUMENTS

CN 101290898 A * 10/2008 ............ H01L 24/03
JP 2006303103 A * 11/2006
(Continued)

*Primary Examiner* — Devang R Patel
(74) *Attorney, Agent, or Firm* — HARNESS, DICKEY & PIERCE, P.L.C.

(57) ABSTRACT

An apparatus for mounting solder balls comprises a stage to support a substrate thereon, a mounting unit to mount solder balls on the substrate, and a solder ball mask between the mounting unit and the substrate. The solder ball mask includes a first face facing the substrate and a second face opposite to the first face. The solder ball mask has inner surfaces defining through-holes extending through a thickness of the solder ball mask from the second face to the first face. The apparatus causes the solder balls to move through separate, respective through-holes. Each of the through-holes includes a first opening defined in the first face and a second opening defined in the second face. A first spacing between adjacent first openings of the plurality of through-holes is different from a second spacing between adjacent second openings of the through-holes.

17 Claims, 16 Drawing Sheets

(51) Int. Cl.
  *H01L 21/48*   (2006.01)
  *H01L 23/00*   (2006.01)
  *H01L 21/683*   (2006.01)
  *H01L 23/498*   (2006.01)

(56) References Cited

U.S. PATENT DOCUMENTS

| | | | |
|---|---|---|---|
| 7,472,473 | B2 | 1/2009 | Kawamura et al. |
| 8,157,157 | B2 * | 4/2012 | Sawa .................. B23K 3/0692 |
| | | | 228/123.1 |
| 10,016,833 | B2 | 7/2018 | Lee et al. |
| 2002/0058406 | A1 * | 5/2002 | Mukuno ............. H01L 21/4853 |
| | | | 438/626 |
| 2008/0182398 | A1 * | 7/2008 | Carpenter ............... H01L 24/49 |
| | | | 438/612 |
| 2009/0294516 | A1 * | 12/2009 | Sawa .................. H05K 3/3478 |
| | | | 228/41 |
| 2014/0103098 | A1 * | 4/2014 | Choi .................... B23K 3/0623 |
| | | | 228/41 |
| 2023/0050785 | A1 * | 2/2023 | Yeh ..................... H01L 21/6835 |

FOREIGN PATENT DOCUMENTS

| | | | | |
|---|---|---|---|---|
| JP | 2017041464 | A  * | 2/2017 | |
| JP | 2019145707 | A | 8/2019 | |
| KR | 10-2004-0108143 | A | 12/2004 | |
| KR | 10-2007-0082316 | A | 8/2007 | |
| KR | 20120072693 | A * | 7/2012 | ............... H05K 3/34 |
| KR | 10-2015-0112178 | A | 10/2015 | |
| KR | 10-2019-0074699 | A | 6/2019 | |

* cited by examiner

APPARATUS FOR MOUNTING SOLDER BALLS

CROSS-REFERENCE TO RELATED APPLICATION

This application claims priority from Korean Patent Application No. 10-2021-0176261 filed on Dec. 10, 2021 in the Korean Intellectual Property Office, and all the benefits accruing therefrom under 35 U.S.C. 119, the contents of which in its entirety are herein incorporated by reference.

BACKGROUND

Field

The present inventive concepts relate to apparatuses for mounting solder balls.

Description of Related Art

With rapid progress of miniaturization and thinning of an electronic device, miniaturization and thinning of an electronic component such as a semiconductor device that is mounted on the electronic device are required. Under high integration of the electronic components, the number of connection terminals increases. An electronic component mounting method for meeting these requirements generally includes a scheme in which a conductive solder ball as an external connection terminal is mounted on a substrate such as a printed circuit board in a pick and place manner or the like.

SUMMARY

A technical purpose to be achieved by the present inventive concepts is to provide an apparatus for mounting solder balls on a substrate using a solder ball mask.

Purposes according to the present inventive concepts are not limited to the above-mentioned purposes. Other purposes and advantages according to the present inventive concepts that are not mentioned may be understood based on following descriptions, and may be more clearly understood based on embodiments according to the present inventive concepts. Further, it will be easily understood that the purposes and advantages according to the present inventive concepts may be realized using means illustrated in the claims and combinations thereof.

According to some example embodiments of the present inventive concepts, an apparatus for mounting solder balls may include a stage configured to support a substrate thereon, a mounting unit configured to mount the solder balls on the substrate, and a solder ball mask between the mounting unit and the substrate, wherein the solder ball mask includes a first face facing the substrate, and a second face opposite to the first face, wherein the solder ball mask has a plurality of inner surfaces defining a plurality of through-holes, the plurality of through-holes extending through a thickness of the solder ball mask from the second face to the first face, wherein the apparatus is configured to cause the solder balls to move through separate, respective through-holes of the plurality of through-holes, wherein each of the plurality of through-holes includes a first opening defined in the first face, and a second opening defined in the second face, wherein a first spacing between adjacent first openings of the plurality of through-holes is different from a second spacing between adjacent second openings of the plurality of through-holes.

According to some example embodiments of the present inventive concepts, there is provided an apparatus for mounting solder balls, the apparatus comprising, a stage configured to support a substrate thereon, solder ball providing units adjacent to the stage and configured to provide the solder balls, a mounting unit configured to move onto the solder ball providing units, pick up the solder balls in the solder ball providing units, move onto the substrate, and place the solder balls onto the substrate, and a solder ball mask between the mounting unit and the substrate, wherein the solder ball mask has a plurality of inner surfaces defining a plurality of through-holes extending through an entirety of a thickness of the solder ball mask, wherein the apparatus is configured to cause the mounting unit to place the solder balls onto the substrate such that the solder balls move from the mounting unit and further move through separate, respective through-holes of the plurality of through-holes to be placed on the substrate, wherein each of the plurality of through-holes has a first opening and a second opening opposite to each other, wherein the first opening and the second opening are not aligned with each other in a plan view of the solder ball mask.

According to some example embodiments of the present inventive concepts, an apparatus for mounting solder balls may include a stage configured to support a substrate thereon, solder ball providing units adjacent to the stage and configured to provide the solder balls, a mounting unit configured to move onto the solder ball providing units, pick up the solder balls in the solder ball providing units, move onto the substrate, and place the solder balls onto the substrate, and a solder ball mask between the mounting unit and the substrate, wherein the solder ball mask includes a first face facing the substrate, and a second face opposite to the first face, wherein the solder ball mask has a plurality of inner surfaces defining a plurality of through-holes and one or more surfaces at least partially defining a discharging groove therein, wherein the apparatus is configured to cause the mounting unit to place the solder balls onto the substrate such that the solder balls move from the mounting unit and further move through separate, respective through-holes of the plurality of through-holes to be placed on the substrate, wherein the apparatus is configured to cause at least one solder ball to move through the discharging groove and to be discharged out of the substrate, wherein each of the plurality of through-holes extends from the second face to the first face, and the discharging groove is recessed in the second face but does not extend to the first face, wherein each of the plurality of through-holes has a first opening defined in the first face, a second opening defined in the second face, and first and second sidewalls opposing each other, wherein a first spacing between adjacent first openings of the plurality of through-holes is smaller than a second spacing between adjacent second openings of the plurality of through-holes, wherein, in each through-hole of the plurality of through-holes, a spacing between the first sidewall and the second sidewall of the through-hole gradually decreases as the through-hole extends in a direction extending perpendicularly from the second face toward the first face.

BRIEF DESCRIPTION OF DRAWINGS

The above and other aspects and features of the present inventive concepts will become more apparent by describing in detail some example embodiments thereof with reference to the attached drawings, in which.

DETAILED DESCRIPTION

Figure 1:
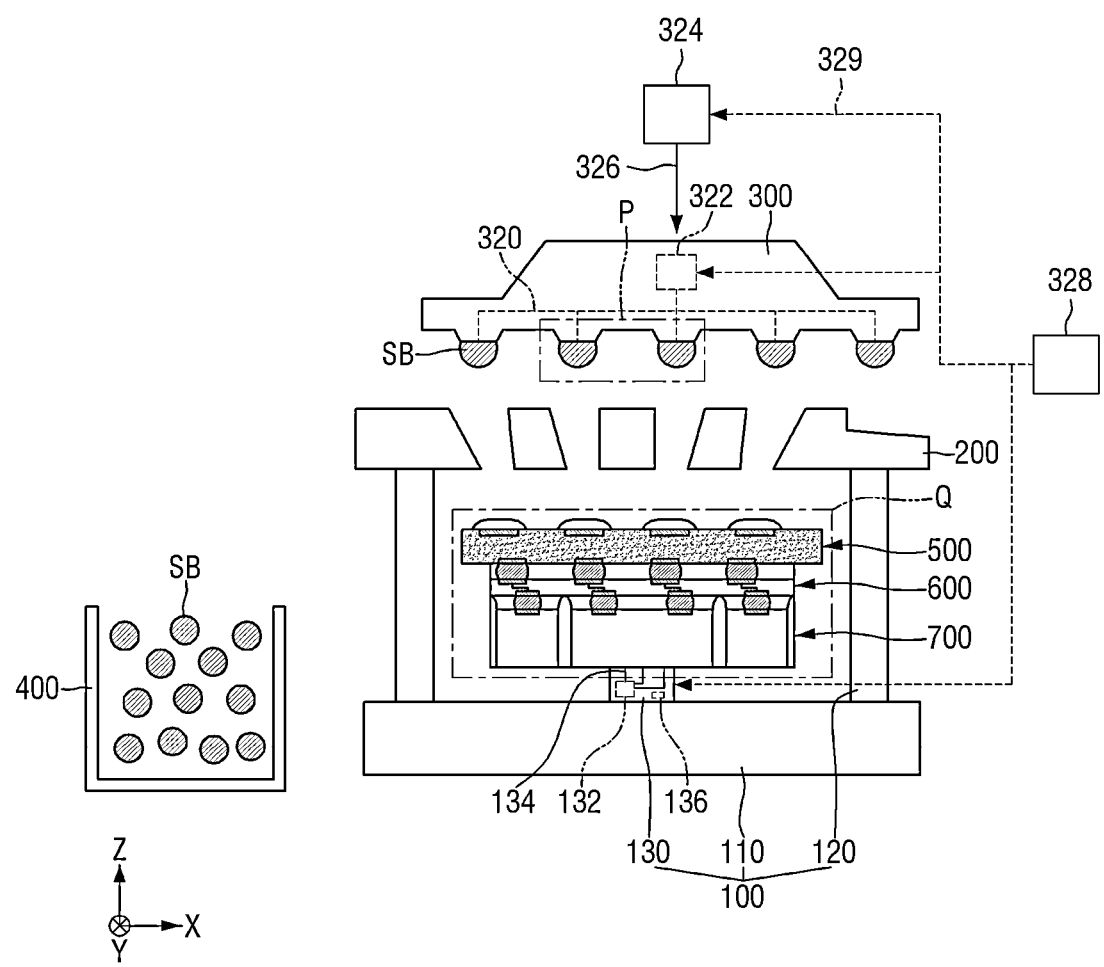
FIG. 1 is an illustrative diagram of an apparatus for mounting solder balls according to some example embodiments.

Hereinafter, to describe the inventive concepts in more detail, some example embodiments according to the inventive concepts will be described in more detail with reference to the accompanying drawings. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Hereinafter, an apparatus for mounting solder balls according to some example embodiments will be described with reference to FIGS. 1 to 10.

Figure 2:
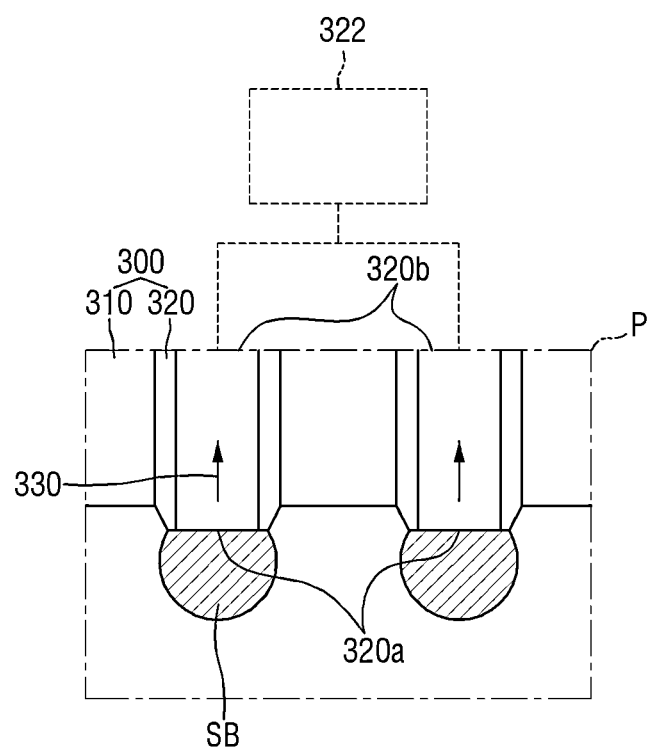
FIG. 2 is an enlarged view of a P area of FIG. 1 according to some example embodiments.

FIG. 1 is an illustrative diagram of an apparatus for mounting solder balls according to some example embodiments. FIG. 2 is an enlarged view of a P area of FIG. 1 according to some example embodiments.

First, referring to FIG. 1, the apparatus for mounting solder balls according to some example embodiments may include a stage 100, a solder ball mask 200, a mounting unit 300 (also referred to herein as a mounting device), and solder ball providing units 400 (also referred to herein as solder ball providing devices).

The stage 100 may include a base unit 110 (also referred to herein as a base device), a solder ball mask support unit 120 (also referred to herein as a solder ball mask support device), and a substrate support unit 130 (also referred to herein as a substrate support device). The base unit 110 may support (e.g., structurally support, also referred to as support the weight and/or load of) both the solder ball mask support unit 120 and the substrate support unit 130. The base unit 110 may include driving elements capable of vertically raising and lowering the substrate support unit 130 and rotating the substrate support unit 130 horizontally.

The substrate support unit 130 may support (e.g., structurally support, also referred to as support the weight and/or load of) a semiconductor package 500, 600, and 700 thereon. The semiconductor package may include the substrate 500, and thus the stage 100 may be understood to support (e.g., structurally support, also referred to as support the weight and/or load of) the substrate 500 thereon. The substrate 500 may be embodied as a circuit board. The substrate support unit 130 may include vacuum adsorption means (e.g., a suction source 132, which may include a vacuum pump) capable of fixing the semiconductor package (e.g., via suction due to the suction source 132 generating a negative pressure in one or more suction ports 134, also referred to as suction conduits, that are in fluid communication with the suction source 132 to fix the semiconductor package thereto due to the negative pressure). The substrate support unit 130 may include driving means (e.g., a driver 136, which may include a servo actuator, servo motor, or the like) which may be independently vertically movable up or down. When the substrate support unit 130 moves up or down, a distance between the solder ball mask 200 and the substrate 500 may be controlled. The solder ball mask support unit 120 may be installed around the base unit 110 so as to support the solder ball mask 200 thereon, for example such that the solder ball mask support unit 120 may include a structural frame that supports the solder ball mask 200 to be vertically spaced apart from the semiconductor package in a vertical direction extending perpendicular to the semiconductor package, for example extending perpendicular to the substrate 500. Further, the solder ball mask support unit 120 may have vacuum adsorption means (e.g., a suction port 134 in fluid communication with the suction source 132 of the substrate support unit 130) capable of fixing the solder ball mask 200. The suction source 132 and the one or more suction ports 134 may be collectively referred to as one or more suctioning units configured to generate a negative pressure (e.g., a vacuum) to "suction" and hold elements in place in relation to the stage based on generating the negative pressure.

The solder ball mask 200 may be interposed on the substrate 500. The solder ball mask 200 may be interposed between the mounting unit 300 and the substrate 500. The solder ball mask 200 may be installed on the solder ball mask support unit 120 and may be fixed to the solder ball mask support unit 120. The solder ball mask 200 will be described in detail later with reference to FIGS. 3 to 9.

The mounting unit 300 may be placed on the substrate 500. The mounting unit 300 may be placed on the solder ball mask 200. The mounting unit 300 may be spaced apart from the solder ball mask 200 in a third direction Z (also referred to herein as a vertical direction). The mounting unit 300 may be movable in each of a first direction X, a second direction Y, and the third direction Z. The first direction X, the second direction Y, and the third direction Z may be substantially perpendicular to each other.

Still referring to FIG. 1, the apparatus (e.g., the mounting unit 300) may include a driver 324 (which may be one or more drivers) that is mechanically coupled 326 to the mounting unit 300 and is configured to move (e.g., translate, rotate, etc.) the mounting unit 300 in one or more directions, including the first, second, and/or third directions X, Y, and/or Z. The driver 324 may be located internal to the mounting unit 300, external to the mounting unit 300, or any combination thereof (e.g., partially external and partially internal to the mounting unit 300), such that the mechanical coupling 326 may in some example embodiments be located internal to the mounting unit 300 (e.g., a structural coupling of the driver 324 to a remainder of the mounting unit 300).

The driver 324 may include a fixed structure (e.g., a rail) with which a portion of the driver (e.g., an actuator, motor, servo, or the like) operates to interact therewith to cause the portion of the driver 324, the mounting unit 300 via the mechanical coupling 326, or the like to move in one or more directions in relation to the stage 100. The driver 324 may include one or more servo actuators, servo motors, servos, motors, or the like. The mechanical coupling 326 of the driver 324 to the mounting unit 300 may include any mechanical coupling, including a direct coupling of the driver 324 to an external and/or internal portion of the mounting unit 300. The driver 324 may be configured to operate to cause the mounting unit 300 to move (e.g., move in relation to the stage 100, the solder ball providing unit 400, any combination thereof, or the like) in one or more directions (e.g., in any direction) as described herein.

Still referring to FIG. 1, the apparatus may include a controller 328 that is communicatively (e.g., electrically) coupled to various elements of the apparatus via one or more communication links 329 (which may be conductive wires, electrical wires, conductive conduits, conductive traces, electrical leads, or the like) and is configured to control the elements to control operation of the apparatus based on transmitting control signals and/or controlling a supply of electrical power to the elements to control operation of the elements. For example, the controller 328 may be configured to control operation of any of the driver 324, the suction source 322, the suction source 132 and/or driver 136 of the substrate support unit 130, any combination thereof, or the like to cause the apparatus to perform any operations as described herein based on the controller 328 transmitting an electrical signal (e.g., a command signal, a supply of electrical power, or the like) to any of the driver 324, the suction source 322, the suction source 132 and/or driver 136 of the substrate support unit 130, any combination thereof, or the like via one or more communication links.

It will be understood that the controller 328 is configured to control operation of any of the driver 324, the suction source 322, the suction source 132 and/or driver 136 of the substrate support unit 130, any combination thereof, or the like, to control operation of the apparatus, based on the controller 328 including processing circuitry configured to implement the controller 328 or any portion thereof, for example based on the processing circuitry, and thus the controller 328, including a memory storing a program of instructions and a processor configured to execute the program of instructions to implement the module or any portion thereof. Any apparatuses, devices, electronic devices, modules, units, and/or portions thereof according to any of the example embodiments, and/or any portions thereof (including, without limitation, the controller 328, the driver 324, the suction source 322, the suction source 132, the driver 136, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, apparatuses, units, and/or portions thereof according to any of the example embodiments.

Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

Referring to FIG. 2, the mounting unit 300 may include a body 310, a suction source 322 (which may include a negative pressure source or vacuum source, such as a vacuum pump) that is configured to generate a negative pressure (e.g., a vacuum) and suctioning units 320, also referred to herein as suction ports, suction conduits, or the like, which may be in fluid communication with the suction source 322 such that a negative pressure or vacuum is generated therein, such that the suctioning units 320 "suck air" thereinto 330 via a first opening 320a (e.g., first port) thereof based on operation of the suction source 322 to generate a negative pressure or vacuum at an opposite, second opening 320b (e.g., opposite, second port) of the suctioning units 320 that is coupled to the suction source 322. The body 310 may surround the suctioning units 320. The suctioning units 320 may refer to a part for fixing the solder ball SB (e.g., the suction conduit coupled to the suction source 322). For example, the suctioning units 320 may suck in air through respective first openings 320a thereof based on operation of the suction source 322 to generate a negative pressure or vacuum at respective second openings 320b thereof. (See a reference number 330). The suctioning units 320 may suction and hold separate, respective solder balls SB in place in relation to the mounting unit 300 (e.g., suction and hold separate, respective solder balls SB against separate, respective first openings 320a of the suctioning units 320) due to the negative pressure at separate, respective second openings 320b of the suctioning units 320 and the sucking of air 330 by the suctioning units 320 as a result. However, the technical idea of the present inventive concepts is not limited thereto.

Referring back to FIG. 1, the solder ball providing units 400 (e.g., solder ball providing unit devices, solder ball containers, etc.) may be located in an area adjacent to the stage 100. The solder ball providing units 400 may be configured to provide the solder ball SB. The solder ball providing units 400 may be spaced apart from the stage 100 in the first direction X. In some example embodiments, the solder ball providing units 400 may be spaced apart from stage 100 in the second direction Y. When the solder ball SB is mounted on the substrate 500 using the apparatus for mounting the solder balls according to some example embodiments, the mounting unit 300 may move onto the solder ball providing units 400 (e.g., move to at least partially or entirely vertically overlap one or more solder ball providing units 400 in the third direction Z) and pick up the solder ball SB in the solder ball providing units 400 (Pick), for example based on the suctioning units 320 sucking and holding one or more solder balls SB against separate, respective first openings 320a of the suctioning units 320 due to operation of the suction source 322. Subsequently, the mounting unit 300 may move onto (e.g., to overlap in the third direction Z) the substrate 500 and may place the solder ball SB on the substrate 500 (Place).

The solder ball SB may be provided from the solder ball providing units 400. The solder ball SB may electrically connect a main board of an electronic device to the semiconductor package. The solder ball SB may be embodied as, for example, a solder bump including, for example, a low melting point metal, for example, tin (Sn) and a tin (Sn) alloy. However, the present inventive concepts are not limited thereto. The solder ball SB may have one of various shapes such as a land, a ball, a pin, and a pillar. As used herein, an example in which the solder ball SB has the ball shape is described.

Figure 3:
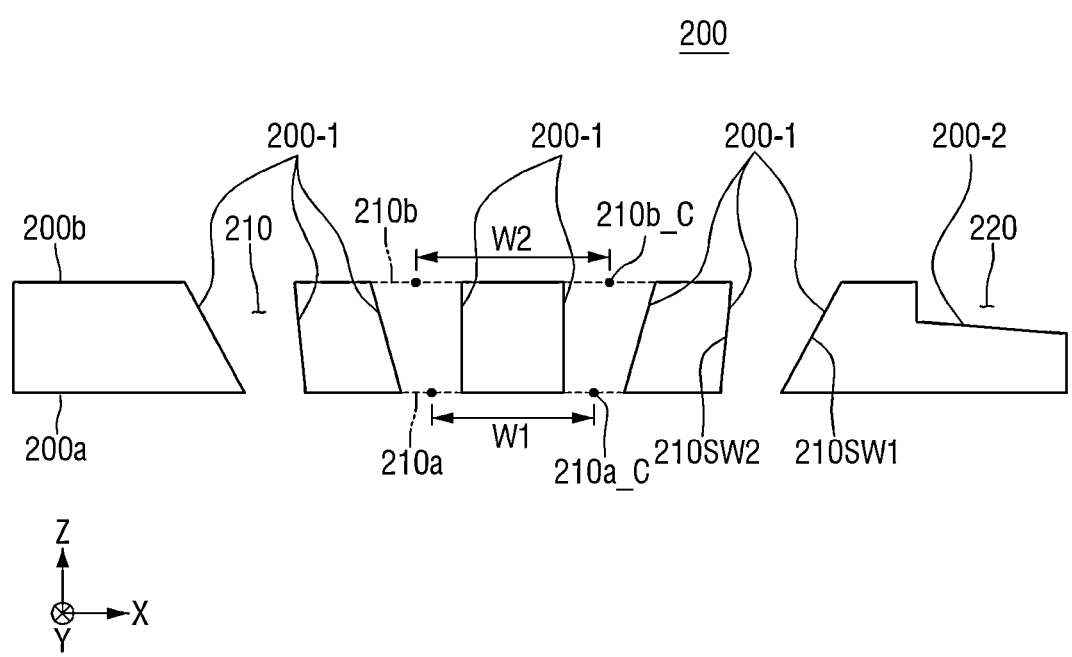
FIG. 3 is an illustrative cross-sectional view of the solder ball mask of FIG. 1 according to some example embodiments.
Figure 4:
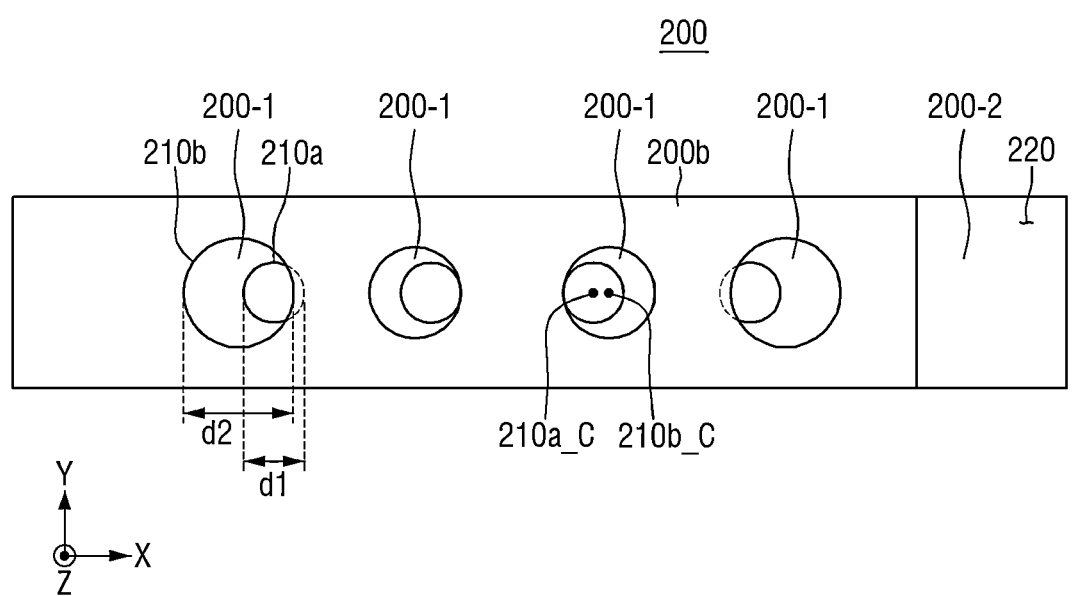
FIG. 4 is an illustrative plan view of the solder ball mask of FIG. 1 according to some example embodiments.

FIG. 3 is an illustrative cross-sectional view of the solder ball mask of FIG. 1 according to some example embodiments. FIG. 4 is an illustrative plan view of the solder ball mask of FIG. 1 according to some example embodiments. Using FIG. 3 and FIG. 4, the present inventive concepts will describe in detail the solder ball mask according to some example embodiments.

Referring to FIG. 3 and FIG. 4, the solder ball mask 200 may include a first face 200a and a second face 200b opposite to each other. The first face 200a may be a face facing the substrate (500 in FIG. 1), and the second face 200b may be a face facing the mounting unit (300 in FIG. 1).

In some example embodiments, the solder ball mask 200 may include one or more inner surfaces 200-1 that define a through-hole 210 and one or more surfaces 200-2 that at least partially define a discharging groove 220. The through-hole 210 may extend through a thickness (e.g., an entire thickness) of the solder ball mask 200 in the third direction Z and may act as a channel through which the solder ball (SB in FIG. 1) moves through the thickness between the opposite first and second faces 200a and 200b of the solder ball mask 200. The solder ball SB may pass through the through-hole 210 and then may be mounted on the substrate (500 of FIG. 1). The discharging groove 220 may not extend through an entirety of the thickness of the solder ball mask 200 and/or may be recessed in the second face 200b and/or may not extend to the first face 200a. The discharging groove 220 may act as a channel through which the solder ball SB is discharged (e.g., discharged away from the solder ball mask 200). The solder ball SB may pass through the discharging groove 220 and then may be discharged out of the substrate 500 (e.g., discharged away from the substrate 500, for example discharged away from the substrate 500 and/or the apparatus so as to not be mounted on the substrate 500).

The through-hole 210 may extend from the second face 200b to the first face 200a (e.g., through a thickness of the solder ball mask 200). The solder ball SB may move through the through-hole 210. The through-hole 210 may include a first opening 210a and a second opening 210b. The first opening 210a may be defined in (e.g., at least partially defined by) the first face 200a of the solder ball mask 200. The second opening 210b may be defined in (e.g., at least partially defined by) the second face 200b of the solder ball mask 200.

In some example embodiments, the first opening 210a and the second opening 210b may not be aligned with each other. The phrase "A and B are aligned with each other" may mean that a center of A and a center of B coincide with each other in a plan view (e.g., the center of A and the center of B overlap in the third direction Z). The phrase "A and B are not aligned with each other" may mean that the center of A and the center of B do not coincide with each other in the plan view (e.g., the center of A and the center of B do not overlap in the third direction Z and thus are offset from each other in one or more directions X and/or Y that are perpendicular to the third direction Z). The first and second directions X and Y may be understood to extend in parallel with the first face 200a and/or the second face 200b and the third direction Z may be understood to extend perpendicular to the first face 200a and/or the second face 200b.

The first opening 210a includes (e.g., at least partially defines) a first center 210a_C. The first center 210a_C is a center of the first opening 210a. The second opening 210b includes (e.g., at least partially defines) a second center 210b_C. The second center 210b_C is a center of the second opening 210b. In FIG. 4, in the plan view, the first center 210a_C and the second center 210b_C may not coincide with each other (e.g., are offset in the first direction X and thus do not overlap in the third direction Z). The first center 210a_C and the second center 210b_C do not overlap each other in the third direction Z. That is, the first opening 210a and the second opening 210b are not aligned with each other.

In some example embodiments, a first spacing W1 by which the first openings 210a (e.g., the respective second centers 210a_C thereof) are spaced apart from each other (e.g., in the first direction X) may be different from a second spacing W2 by which the second openings 210b (e.g., the respective second centers 210b_C thereof) are spaced apart from each other (e.g., in the first direction X). For example, the first spacing W1 may be smaller than the second spacing W2. "The spacing by which the openings are spaced apart from each other" may mean a spacing between centers of the openings.

Accordingly, the first spacing W1 by which the first openings 210a are spaced apart from each other may be a spacing between the first center 210a_C of the first opening 210a and the first center 210a_C of another first opening 210a adjacent thereto. The second spacing W2 by which the second openings 210b are spaced apart from each other may be a spacing between the second center 210b_C of the second opening 210b and the second center 210b_C of another second opening 210b adjacent thereto. In FIG. 3, the first spacing W1 may be smaller than the second spacing W2.

Since the first spacing W1 is smaller than the second spacing W2, a distance between the solder balls SB mounted on the mounting unit 300 may be large, while a distance between the solder balls SB mounted on the substrate 500 may be small. Thus, even when the same mounting unit 300 is used, the solder balls SB may be mounted on the substrate 500 at various pitches therebetween according to a design of the solder ball mask 200.

In some example embodiments, the through-hole 210 may include a first sidewall 210SW1 and a second sidewall 210SW2. The first sidewall 210SW1 and the second sidewall 210SW2, which may be defined by one or more inner surfaces 200-1 of the solder ball mask 200, may face each other and thus may be opposing surfaces. A slope of the first sidewall 210SW1 and a slope of the second sidewall 210SW2 may be different from each other. The slope of the first sidewall 210SW1 and the slope of the second sidewall 210SW2 may be understood to be a slope of the respective sidewalls in relation to one or more of the third direction Z, the first direction X, the second direction Y, the first face 200a, and/or the second face 200b. The slope of the first sidewall 210SW1 may be smaller than the slope of the second sidewall 210SW2. That is, a spacing between the first sidewall 210SW1 and the second sidewall 210SW2 may gradually decrease as the through-hole 210 extends in a direction from the second face 200b toward the first face 200a (e.g., in the third direction Z which extends perpendicularly from the second face 200b toward the first face 200a). As shown, the first and second sidewalls 210SW1 and 210SW2 may be separate portions of a singular cylindrical surface defined by a singular inner surface 200-1 of the solder ball mask 200.

In some example embodiments, a first diameter d1 of the first opening 210a may be different from a second diameter d2 of the second opening 210b. The first diameter d1 of the first opening 210a may be a diameter of the first opening 210a, and the second diameter d2 of the second opening 210b may be a diameter of the second opening 210b. In FIG. 4, in a plan view (e.g., a view where the third direction Z extends perpendicularly into and/or out of the view), the first diameter d1 may be smaller than the second diameter d2. That is, in a plan view, an area of the first opening 210a may be smaller than an area of the second opening 210b.

Figure 5:
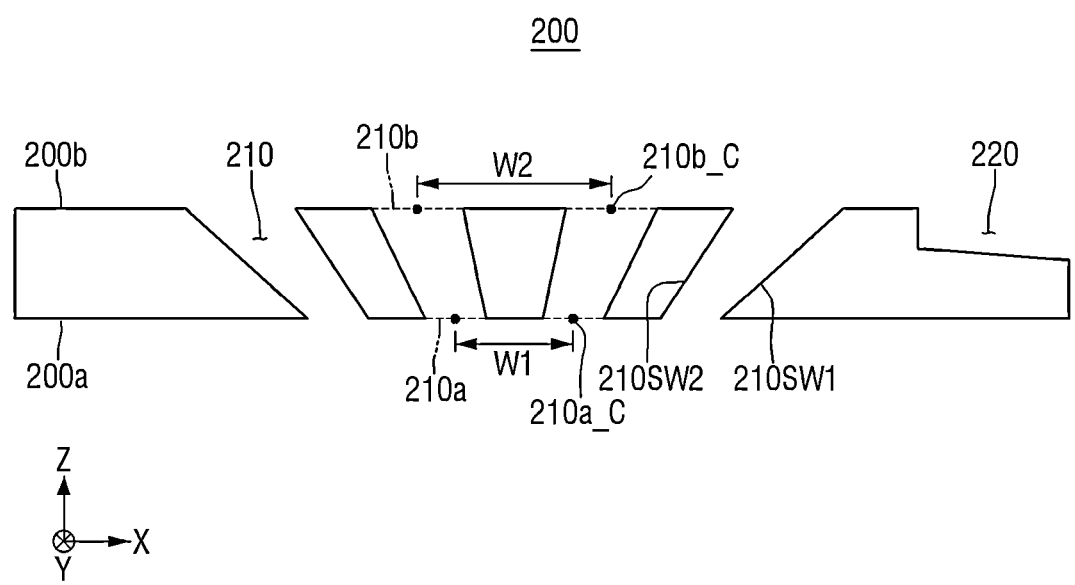
FIG. 5 is an illustrative cross-sectional view of a solder ball mask according to some example embodiments.
Figure 6:
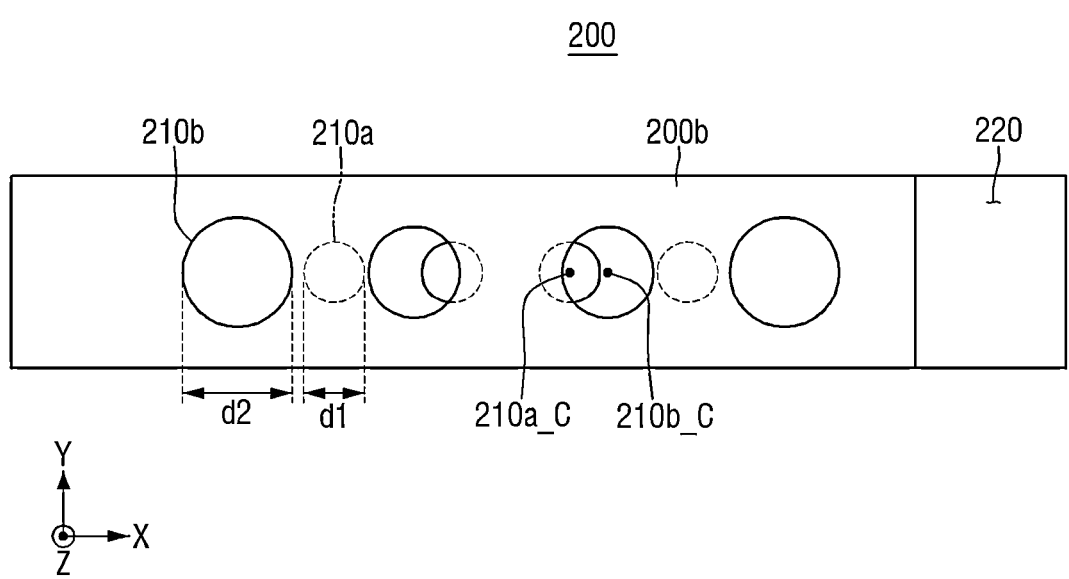
FIG. 6 is a top view of the solder ball mask of FIG. 5 according to some example embodiments.

FIG. 5 is an illustrative cross-sectional view of a solder ball mask according to some example embodiments. FIG. 6 is a top view of the solder ball mask of FIG. 5 according to some example embodiments. For convenience of description, differences thereof from those set forth above with reference to FIGS. 3 and 4 will be mainly described.

Referring to FIG. 5 and FIG. 6, a portion of the first opening 210a may not overlap the second opening 210b in the third direction Z.

For example, the first opening 210a located at an edge among a plurality of first openings 210a may not overlap a corresponding second opening 210b in the third direction Z. As a difference between a slope of the first sidewall 210SW1 and a slope of the second sidewall 210SW2 of the through-hole 210 located at the edge becomes smaller, the portion of the first opening 210a may not overlap the second opening 210b in the third direction Z.

In some example embodiments, the first spacing W1 by which the first openings 210a are spaced apart from each other may be smaller than the second spacing W2 by which the second openings 210b are spaced apart from each other. The first diameter d1 of the first opening 210a may be smaller than the second diameter d2 of the second opening 210b.

Figure 7:
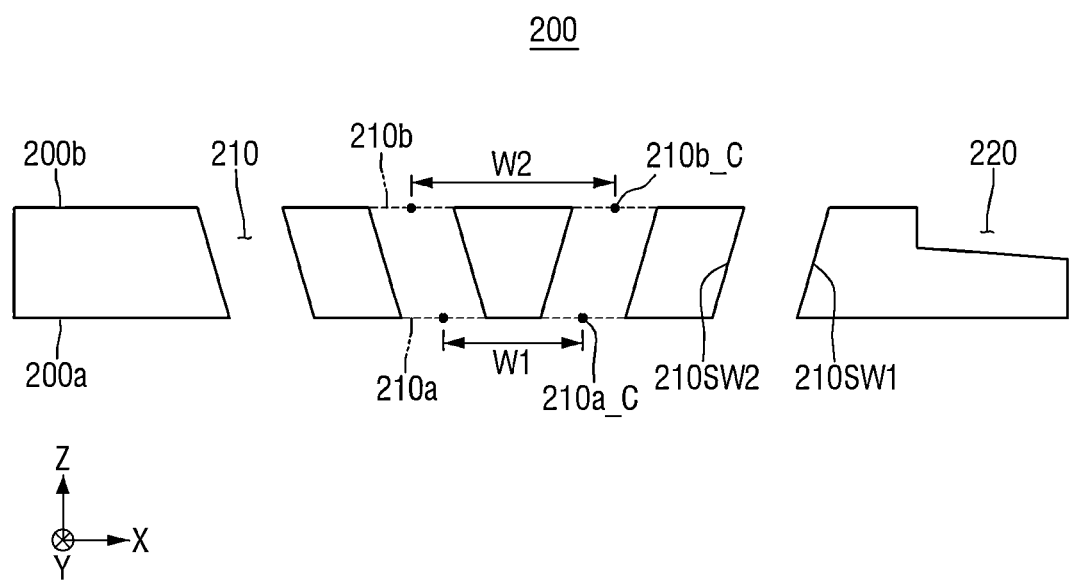
FIG. 7 is an illustrative cross-sectional view of a solder ball mask according to some example embodiments.
Figure 8:
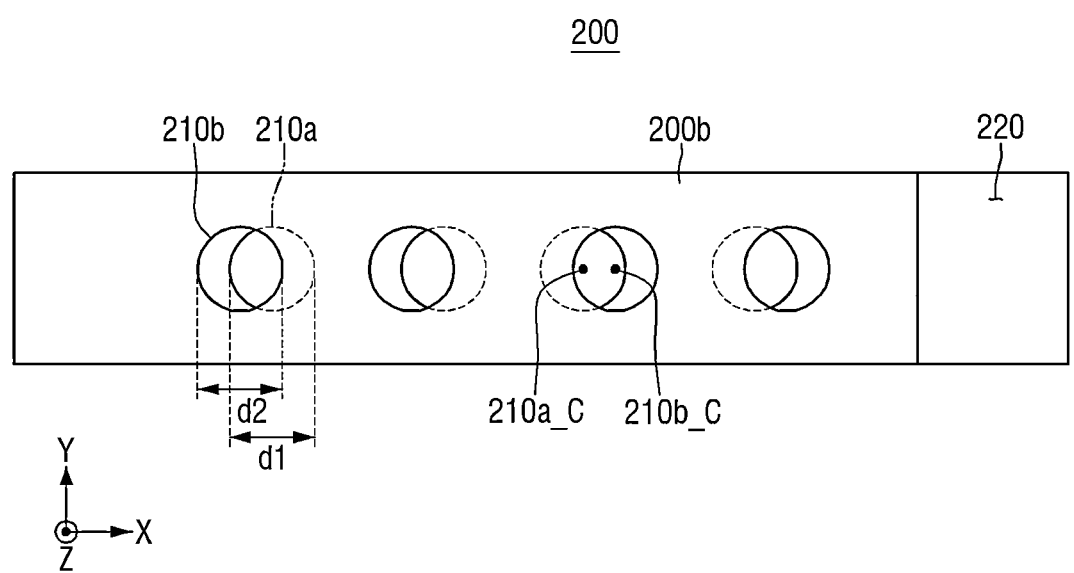
FIG. 8 is a top view of the solder ball mask of FIG. 7 according to some example embodiments.

FIG. 7 is an illustrative cross-sectional view of a solder ball mask according to some example embodiments. FIG. 8 is a top view of the solder ball mask of FIG. 7 according to some example embodiments. For convenience of description, differences thereof from those set forth above with reference to FIGS. 3 and 4 will be mainly described.

Referring to FIG. 7 and FIG. 8, the first diameter d1 of the first opening 210a may be equal to the second diameter d2 of the second opening 210b. In a plan view, an area (e.g., cross-sectional area in a plane extending parallel to the first and second directions X and Y) of the first opening 210a may be equal to an area of the second opening 210b.

The slope of the first sidewall 210SW1 of the through-hole 210 and the slope of the second sidewall 210SW2 of the through-hole 210 may be equal (e.g., equal in magnitude) to each other. A width in the first direction X of the through-hole 210 may be constant as the through-hole 210 extends in a direction from the second face 200b toward the first face 200a (e.g., in the third direction Z).

In some example embodiments, the first spacing W1 by which the first openings 210a are spaced apart from each other may be smaller than the second spacing W2 by which the second openings 210b are spaced apart from each other.

Figure 9:
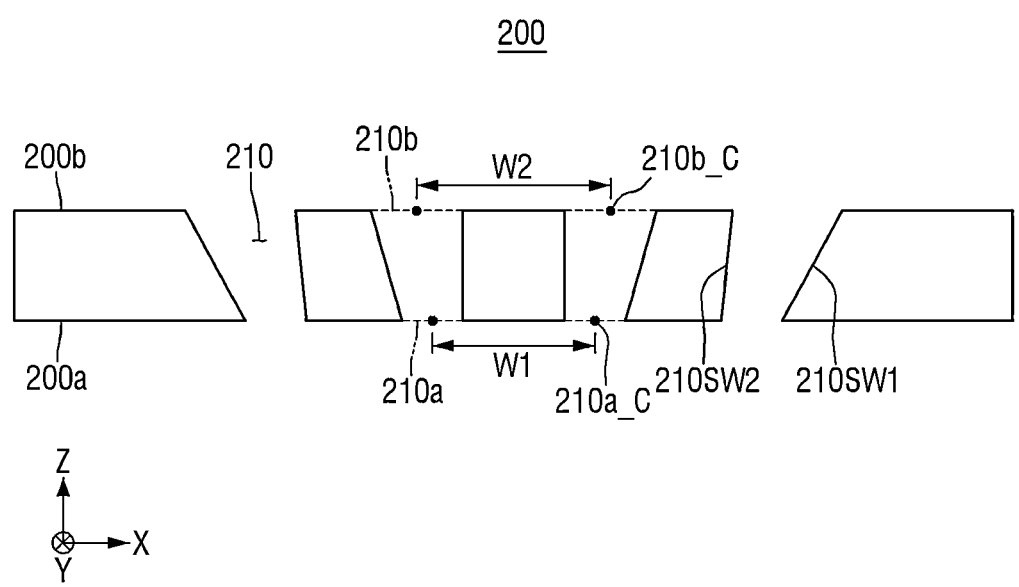
FIG. 9 is an illustrative cross-sectional view of a solder ball mask according to some example embodiments.

FIG. 9 is an illustrative cross-sectional view of a solder ball mask according to some example embodiments. For convenience of description, differences thereof from those set forth above with reference to FIGS. 3 and 4 will be mainly described.

Referring to FIG. 9, the solder ball mask according to some example embodiments may not include the discharging groove. Since the discharging groove is not formed, the through-holes 210 and the suctioning units 320 of the mounting unit 300 may correspond to each other in a one-to-one manner.

Figure 10:
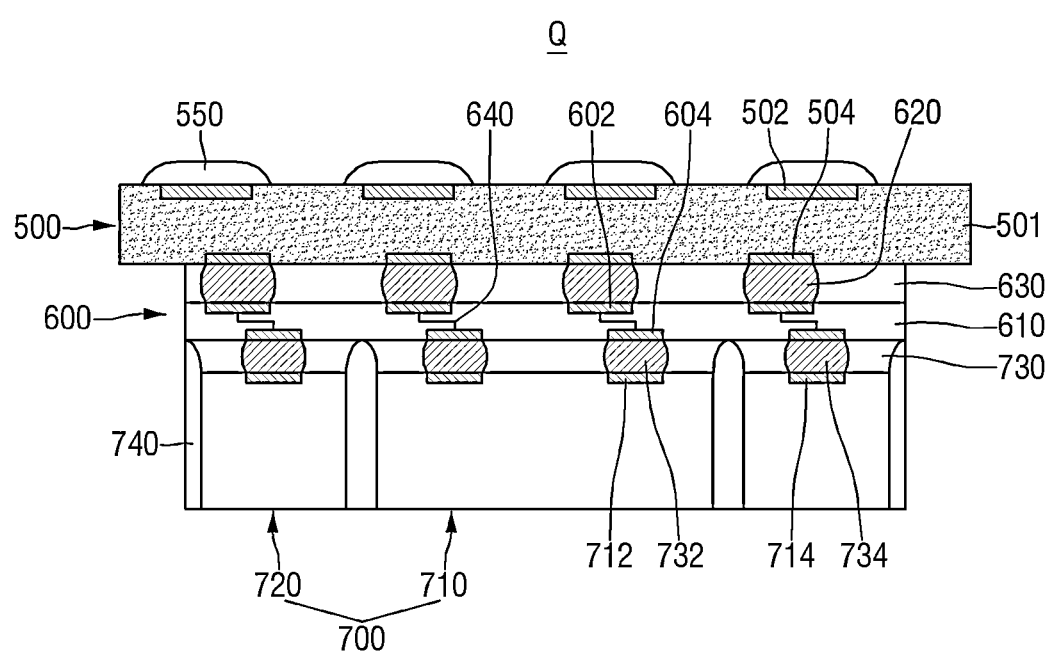
FIG. 10 is an enlarged view of a Q area of FIG. 1 according to some example embodiments.

FIG. 10 is an enlarged view of a Q area of FIG. 1 according to some example embodiments. Referring to FIG. 10, the semiconductor package according to some example embodiments may be embodied as a 2.5D package. However, this is only an example, and the technical idea of the present inventive concepts is not limited thereto.

The semiconductor package according to some example embodiments may include the substrate 500, an interposer structure 600, a semiconductor chip 700, and a molding member 740.

The interposer structure 600 may be mounted on the substrate 500. The semiconductor chip 700 may be mounted on the interposer structure 600. The semiconductor chip 700 may include a first semiconductor chip 710 and a second semiconductor chip 720. The first semiconductor chip 710 and the second semiconductor chip 720 may be disposed to be spaced apart from each other in the first direction X. The second semiconductor chip 720 may be disposed on each of one side and the other side of the first semiconductor chip 710.

The substrate 500 may be a substrate for a package. The substrate 500 may be embodied as a printed circuit board (PCB). The substrate 500 may include bottom and top faces opposite to each other.

The substrate 500 may include an insulating core 501, a first substrate pad 502 and a second substrate pad 504. Each of the first substrate pad 502 and the second substrate pad 504 may be used to electrically connect the substrate 500 to other components. For example, the first substrate pad 502 may not be covered with a top face of the insulating core 501 so as to be exposed, while the second substrate pad 504 may not be covered with a bottom face of the insulating core 501 so as to be exposed. Each of the first substrate pad 502 and the second substrate pad 504 may include, but is not limited to, a metal material such as, for example, copper (Cu) or aluminum (Al).

Wiring patterns for electrically connecting the first substrate pad 502 and the second substrate pad 504 to each other may be formed in the insulating core 501. The insulating core 501 is illustrated as being embodied as a single layer. However, this is intended only for convenience of illustration. In another example, the insulating core 501 may be composed of multiple layers, while the wiring patterns may be formed in each of the multiple layers thereof.

The substrate 500 may be mounted on the main board of the electronic device. For example, the solder ball connected to the first substrate pad 502 may be mounted on the first substrate pad 502. The solder ball may be mounted using the apparatus for mounting the solder balls according to some example embodiments. The substrate 500 may be mounted on the main board of the electronic device via the solder balls. The substrate 500 may be embodied as a BGA (Ball Grid Array) substrate. However, the present inventive concepts are not limited thereto.

In some example embodiments, the insulating core 501 may include an organic material. For example, the insulating core 501 may include a pre-preg. The pre-preg may refer to a composite fiber in which a reinforcing fiber such as carbon fiber, glass fiber, or aramid fiber is pre-impregnated with a thermosetting polymer binder, for example, an epoxy resin or a thermoplastic resin.

In some example embodiments, the substrate 500 may include a copper-clad laminate (CCL). For example, the substrate 500 may have a structure in which a copper clad is laminated on one face or both opposing faces of a thermally cured prepreg (for example, a prepreg of a C-stage).

A flux 550 may be placed on the first substrate pad 502. The flux 550 may cover an entirety of the first substrate pad 502. The flux 550 may later allow the solder ball to reliably adhere to the first substrate pad 502.

The interposer structure 600 may be disposed on a top face of the substrate 500. The interposer structure 600 may be, for example, a silicon interposer. However, the present inventive concepts are not limited thereto. The interposer structure 600 may include bottom and top faces opposite to each other. The interposer structure 600 may facilitate connection between the substrate 500 and the semiconductor chips 700 to be described later, and may reduce or prevent warpage of the semiconductor package.

The interposer structure 600 may include a first interposer pad 602 and a second interposer pad 604. Each of the first interposer pad 602 and the second interposer pad 604 may be used to electrically connect the interposer structure 600 to other components. For example, the first interposer pad 602 may not be covered with the top face of the interposer structure 600 so as to be exposed, while the second interposer pad 604 may not be covered with the bottom face of the interposer structure 600 so as to be exposed.

Each of the first interposer pad 602 and the second interposer pad 604 may include, for example, a metal material such as copper (Cu) or aluminum (Al). However, the present inventive concepts are not limited thereto. Wiring patterns for electrically connecting the first interposer pad 602 and the second interposer pad 604 to each other may be formed in the interposer structure 600.

The interposer structure 600 may be mounted on the bottom face of the substrate 500. For example, a first connection member 620 may be formed between the substrate 500 and the interposer structure 600. The first connection member 620 may connect the second substrate pad 504 and the first interposer pad 602 to each other. Accordingly, the substrate 500 and the interposer structure 600 may be electrically connected to each other.

The first connection member 620 may be embodied as a solder bump including a low melting point metal, for example, tin (Sn) and a tin (Sn) alloy. However, the present inventive concepts are not limited thereto. The first connection member 620 may have one of various shapes such as a land, a ball, a pin, and a pillar. The first connection member 620 may be formed as a single layer or as multiple layers. When the first connection member 620 is formed as the single layer, the first connection member 620 may include, for example, a tin-silver (Sn—Ag) solder or copper (Cu). When the first connection member 620 is formed as the multiple layers, the first connection member 620 may include, for example, a copper (Cu) filler and a solder. The number, spacing, arrangement, etc. of the first connection members 620 are not limited to those as illustrated and may vary according to a design.

In some example embodiments, the interposer structure 600 may include an interposer 610 and a redistribution layer 640. The interposer 610 may be embodied as, for example, a silicon film. However, the present inventive concepts are not limited thereto.

In some example embodiments, a first underfill 630 may be formed between the substrate 500 and the interposer structure 600. The first underfill 630 may fill a space between the substrate 500 and the interposer structure 600. Further, the first underfill 630 may cover the first connection member 620. The first underfill 630 may fix the interposer structure 600 on the substrate 500 to reduce or prevent the interposer structure 600 from being damaged. The first underfill 630 may include, for example, an insulating polymer material such as an EMC (epoxy molding compound). However, the present inventive concepts are not limited thereto.

The first semiconductor chip 710 and the second semiconductor chip 720 may be spaced apart from each other in the first direction X while being disposed on the bottom face of the interposer structure 600. Each of the first semiconductor chip 710 and the second semiconductor chip 720 may be embodied as an integrated circuit (IC) in which hundreds to millions of semiconductor elements are integrated into one chip.

In some example embodiments, the first semiconductor chip 710 may be embodied as a logic semiconductor chip. For example, the first semiconductor chip 710 may be embodied as an application processor (AP) such as CPU (Central Processing Unit), GPU (Graphic Processing Unit), FPGA (Field-Programmable Gate Array), DSP (Digital Signal Processor), CP (Cryptographic Processor), a microprocessor, microcontroller, ASIC (Application-Specific IC), etc. However, the present inventive concepts are not limited thereto.

In some example embodiments, the second semiconductor chip 720 may be embodied as a memory semiconductor chip. For example, the second semiconductor chip 720 may be embodied as a volatile memory such as DRAM (dynamic random access memory) or SRAM (static random access memory). In some example embodiments, the second semiconductor chip 720 may be embodied as a non-volatile memory such as a flash memory, PRAM (Phase-change Random Access Memory), MRAM (Magnetoresistive Random Access Memory), FeRAM (Ferroelectric Random Access Memory) or RRAM (Resistive Random Access Memory).

For example, the first semiconductor chip 710 may be embodied as an ASIC such as a GPU, while the second semiconductor chip 720 may be embodied as a stack memory such as HBM (High Bandwidth Memory). The stack memory may have a structure in which a plurality of integrated circuits are stacked on top of each other. The stacked integrated circuits may be electrically connected to each other via a TSV (Through Silicon Via) or the like.

In some example embodiments, the number of the second semiconductor chips 720 may greater than that of the first semiconductor chips 710. For example, a plurality of second semiconductor chips 720 may be arranged around the first semiconductor chip 710. For example, as shown in FIG. 10, two second semiconductor chips 720 may be disposed on both opposing sides of the first semiconductor chip 710, respectively.

The first semiconductor chip 710 may include a first chip pad 712. The first chip pad 712 may be used to electrically connect the first semiconductor chip 710 to other components. For example, the first chip pad 712 may not be covered with a top face of the first semiconductor chip 710 so as to be exposed.

The second semiconductor chip 720 may include a second chip pad 714. The second chip pad 714 may be used to electrically connect the second semiconductor chip 720 with other components. For example, the second chip pad 714 may not be covered with a top face of the second semiconductor chip 720 so as to be exposed.

Each of the first chip pad 712 and the second chip pad 714 may include, for example, a metal material such as copper (Cu) or aluminum (Al). However, the present inventive concepts are not limited thereto.

The first semiconductor chip 710 and the second semiconductor chip 720 may be mounted on a bottom face of the interposer structure 600. For example, a second connection member 732 may be formed between the interposer structure 600 and the first semiconductor chip 710. The second connection member 732 may connect some of a plurality of second interposer pads 604 to the first chip pad 712. Accordingly, the interposer structure 600 and the first semiconductor chip 710 may be electrically connected to each other.

Further, for example, a third connection member 734 may be formed between the interposer structure 600 and the second semiconductor chip 720. The third connection member 734 may connect the second chip pad 714 to others of the plurality of second interposer pads 604. Accordingly, the interposer structure 600 and the second semiconductor chip 720 may be electrically connected to each other.

In some example embodiments, a portion of the redistribution layer 640 may electrically connect the second connection member 732 and the third connection member 734 to each other. For example, although not shown, the portion of the redistribution layer 640 may connect the second interposer pad 604 connected to the second connection member 732 and the second interposer pad 604 connected to the third connection member 734 to each other. Accordingly, the first semiconductor chip 710 and the second semiconductor chip 720 may be electrically connected to each other.

Each of the second connection member 732 and the third connection member 734 may be embodied as a solder bump including a low melting point metal, for example, tin (Sn) and a tin (Sn) alloy. However, the present inventive concepts are not limited thereto. Each of the second connection member 732 and the third connection member 734 may have one of various shapes, such as a land, a ball, a pin, and a pillar. Each of the second connection member 732 and the third connection member 734 may include, but is not limited to, UBM (Under Bump Metallurgy).

In some example embodiments, a second underfill 730 may be formed between the interposer structure 600 and the first semiconductor chip 710 and between the interposer structure 600 and the second semiconductor chip 720. A portion of the second underfill 730 may fill a space between the interposer structure 600 and the first semiconductor chip 710, and another portion of the second underfill 730 may fill a space between the interposer structure 600 and the second semiconductor chip 720. The second underfill 730 may fix the first and second semiconductor chips 710 and 720 onto the interposer structure 600 to reduce or prevent the first and second semiconductor chips 710 and 720 from being damaged. The second underfill 730 may include, for example, an insulating polymer material such as EMC. However, the present inventive concepts are not limited thereto.

The molding member 740 may be formed on the bottom face of the interposer structure 600. The molding member 740 may be formed to cover at least a portion of each of the first and second semiconductor chips 710 and 720. For example, the molding member 740 may cover a side face of the first semiconductor chip 710, a side face of the second semiconductor chip 720, and the second underfill 730. Although the molding member 740 exposes the top face of the first semiconductor chip 710 and the top face of the second semiconductor chip 720, this is only an example. In another example, the molding member 740 may cover the top face of the first semiconductor chip 710 and the top face of the second semiconductor chip 720.

The molding member 740 may include, for example, an insulating polymer material such as EMC. However, the present inventive concepts are not limited thereto. In some example embodiments, each of the first underfill 630 and the second underfill 730 may include a material different from that of the molding member 740. For example, each of the first underfill 630 and the second underfill 730 may include an insulating material having superior fluidity than fluidity of the molding member 740. Accordingly, each of the first underfill 630 and the second underfill 730 may efficiently fill a narrow space between the substrate 500 and the interposer structure 600 or between the interposer structure 600 and each of the first and second semiconductor chips 710 and 720.

Figure 11:
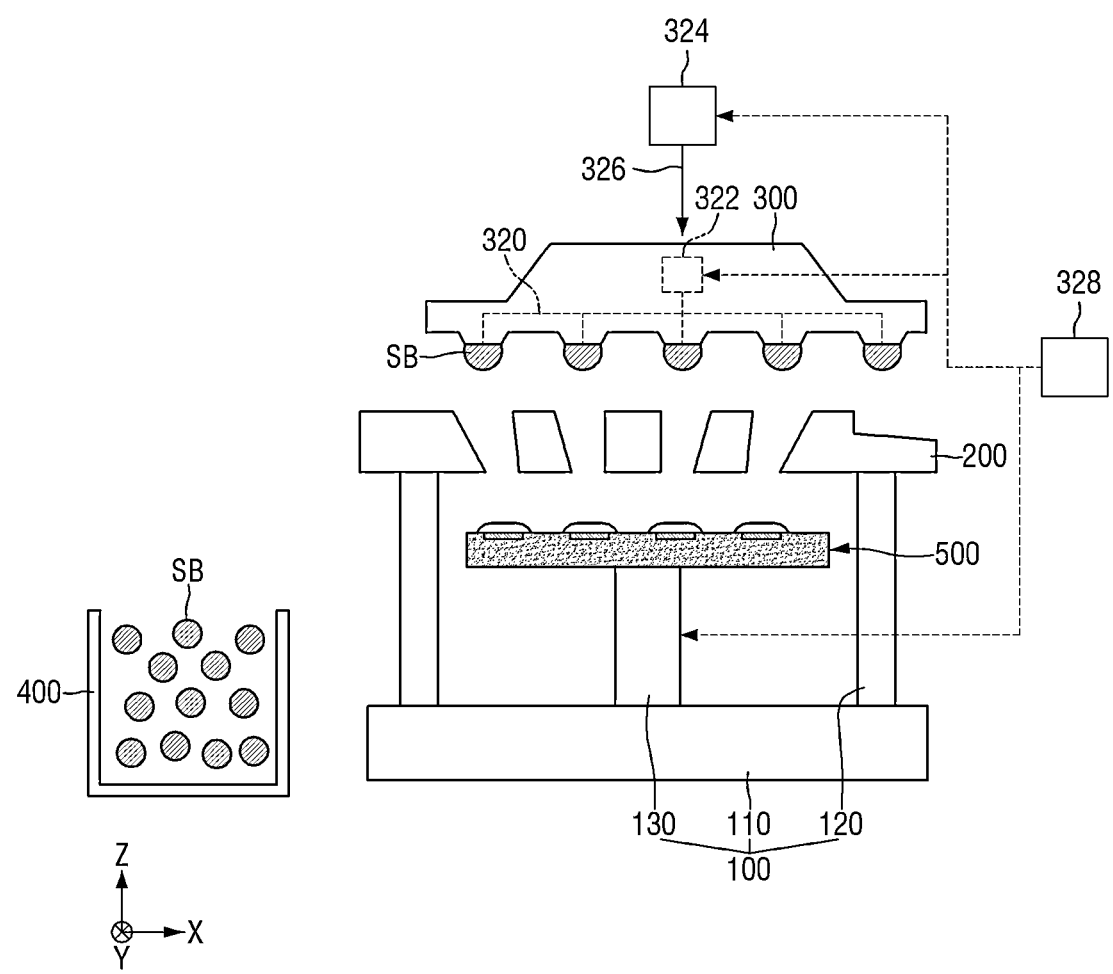
FIG. 11 and FIG. 12 are views for illustrating an apparatus for mounting solder balls according to some example embodiments.
Figure 12:
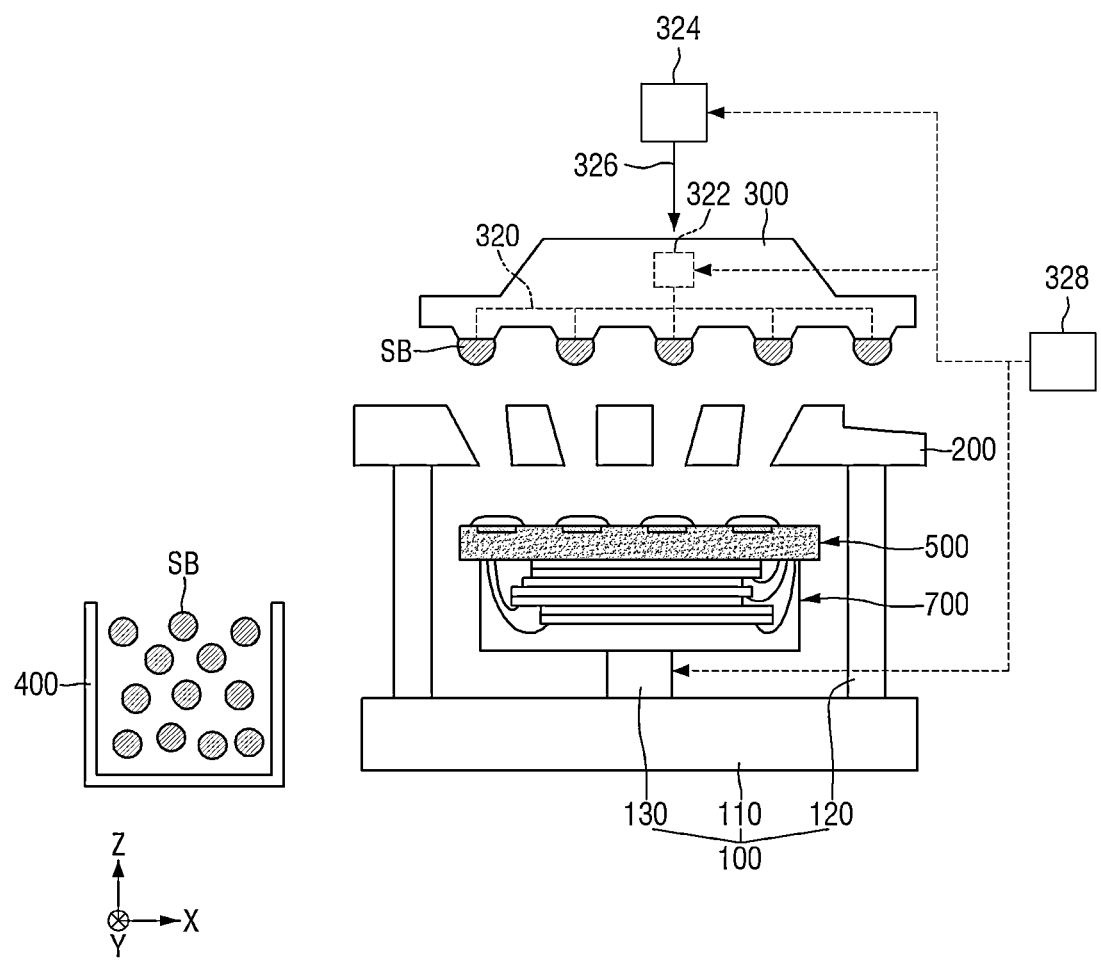

FIG. 11 and FIG. 12 are views for illustrating an apparatus for mounting solder balls according to some example embodiments. For convenience of description, following descriptions will be focused on differences thereof from those set forth above with reference to FIGS. 1 to 10.

Referring to FIG. 11, in the apparatus for mounting the solder balls according to some example embodiments, the semiconductor package according to some example embodiments may include only the substrate 500. The substrate 500 may be a substrate for a package. For example, the substrate 500 may be embodied as a printed circuit board (PCB). The substrate support unit 130 may move up in the third direction Z to position the substrate 500 at a location close to the solder ball mask 200.

Referring to FIG. 12, in the apparatus for mounting the solder balls according to some example embodiments, the semiconductor package according to some example embodiments may include the semiconductor chips 700 on the substrate 500. The semiconductor package may not include an interposer. The semiconductor chips 700 may have a wire bonding structure.

However, the technical idea of the present inventive concepts is not limited thereto. The semiconductor package according to some example embodiments is not limited in terms of a structure or a shape, and may be embodied in a circuit board unit or a package unit.

Figure 13:
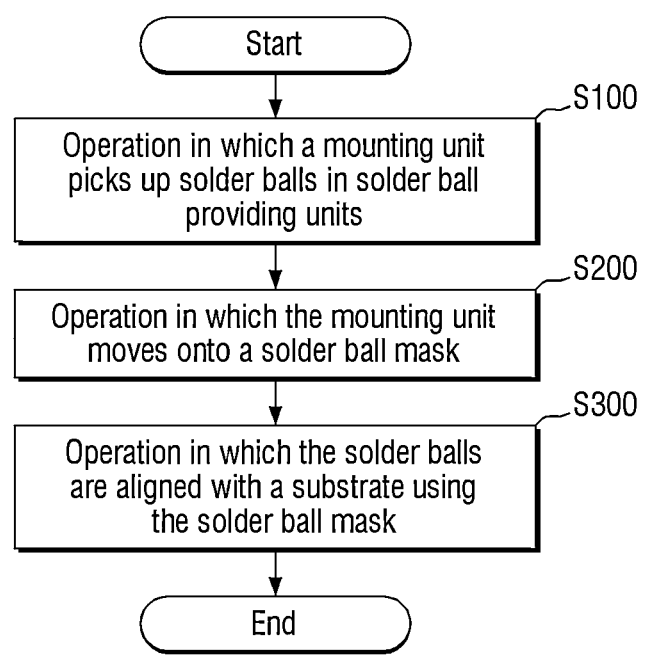
FIG. 13 is a flowchart for illustrating a method for mounting solder balls according to some example embodiments.

FIG. 13 is a flowchart for illustrating a method for mounting solder balls according to some example embodiments. FIGS. 14, 15, 16, 17, and 18 are intermediate views for illustrating a method for mounting solder balls according to some example embodiments. The operation may be implemented by an apparatus according to any of the example embodiments, for example based on the controller 328 of the apparatus executing a program of instructions to control one or more units, devices or the like of the apparatus.

Referring to FIG. 13, the method for mounting the solder balls according to some example embodiments may include operation S100 in which the mounting unit picks up the solder balls in the solder ball providing units; operation S200 in which the mounting unit moves onto the solder ball mask; and operation S300 in which the solder balls are aligned with the substrate (e.g., positioned at and/or aligned with particular locations on the substrate) using the solder ball mask.

Figure 14:
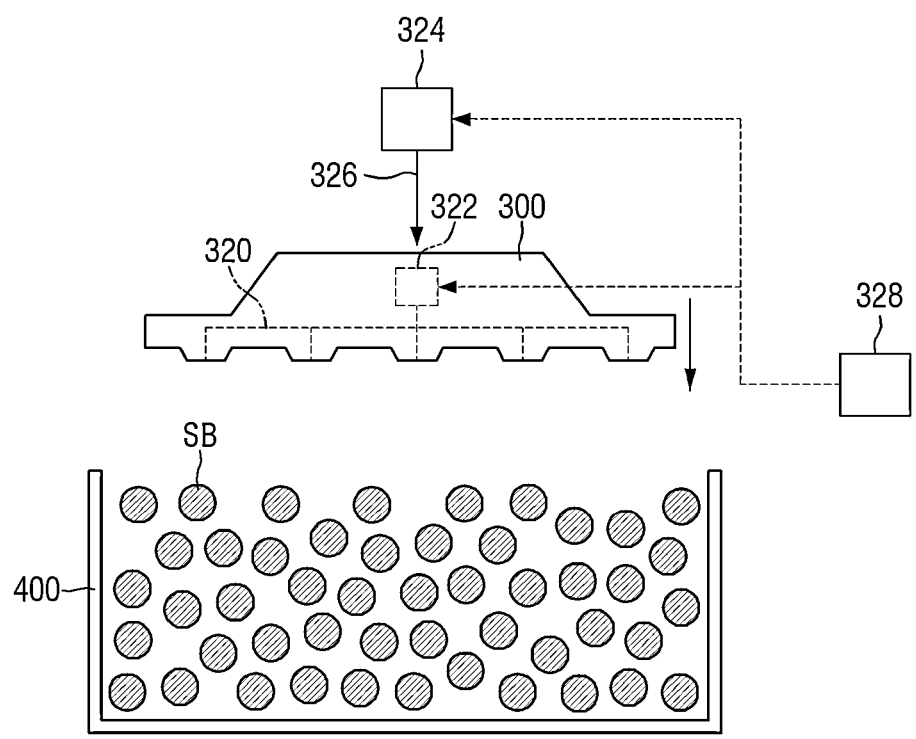
FIGS. 14, 15, 16, 17, and 18 are intermediate views for illustrating a method for mounting solder balls according to some example embodiments.

Referring to FIG. 1, FIG. 13 and FIG. 14, the mounting unit 300 may move in the first direction X. The mounting unit 300 may move to a position overlapping the solder ball providing units 400 in the third direction Z. The mounting unit 300 may be positioned above the solder ball providing units 400.

Subsequently, the mounting unit 300 may move down in the third direction Z. The mounting unit 300 may pick up the solder balls SB in the solder ball providing units 400. For example, the suctioning units (320 of FIG. 2) of the mounting unit 300 may suction and hold the solder balls SB. Subsequently, the mounting unit 300 may move up in the third direction Z.

Figure 15:
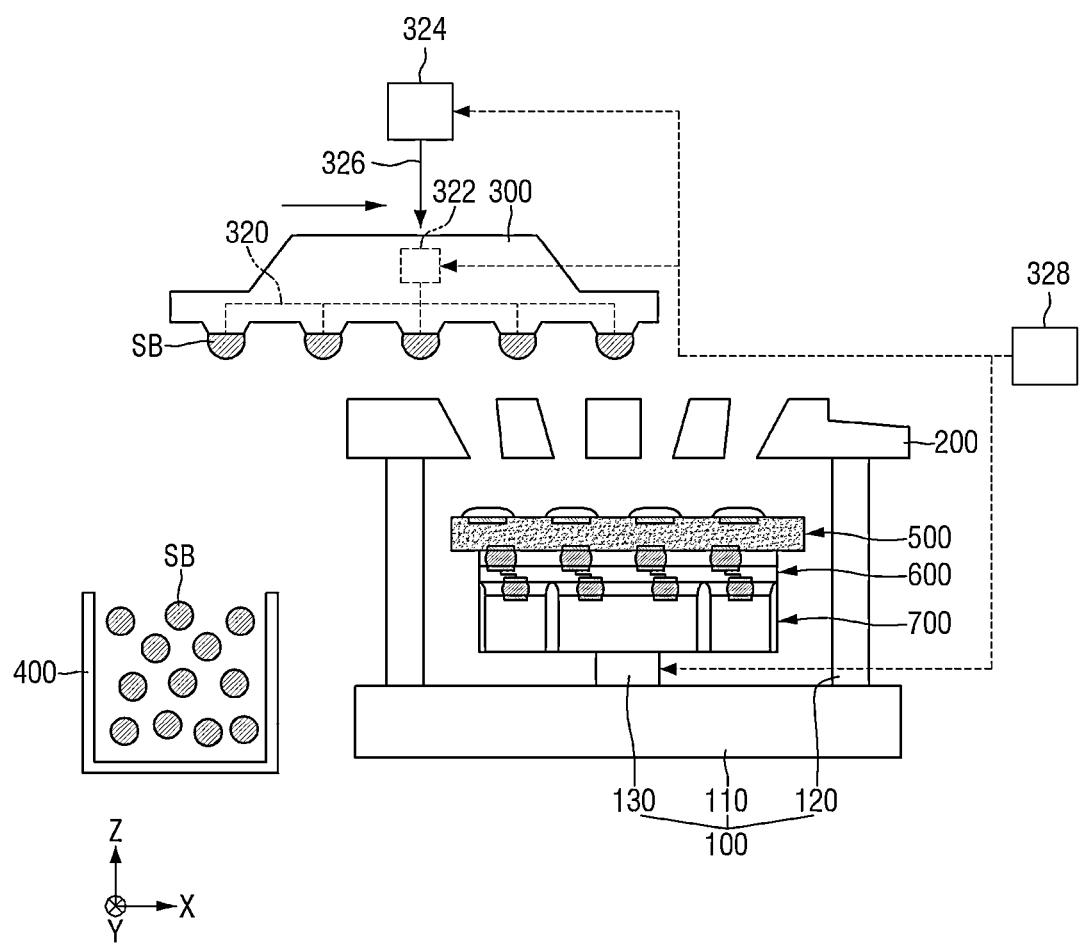

Referring to FIG. 13 and FIG. 15, the mounting unit 300 may move up in the third direction Z while the solder balls SB are held thereby. After ascending in the third direction Z, the mounting unit 300 may move in the first direction X. The mounting unit 300 may move onto the solder ball mask 200 in S200. When the stage 100 and the solder ball providing units 400 are spaced apart from each other in the second direction Y, the mounting unit 300 may move in the second direction Y so as to be positioned at a position overlapping the solder ball mask 200 in the third direction Z.

Figure 16:
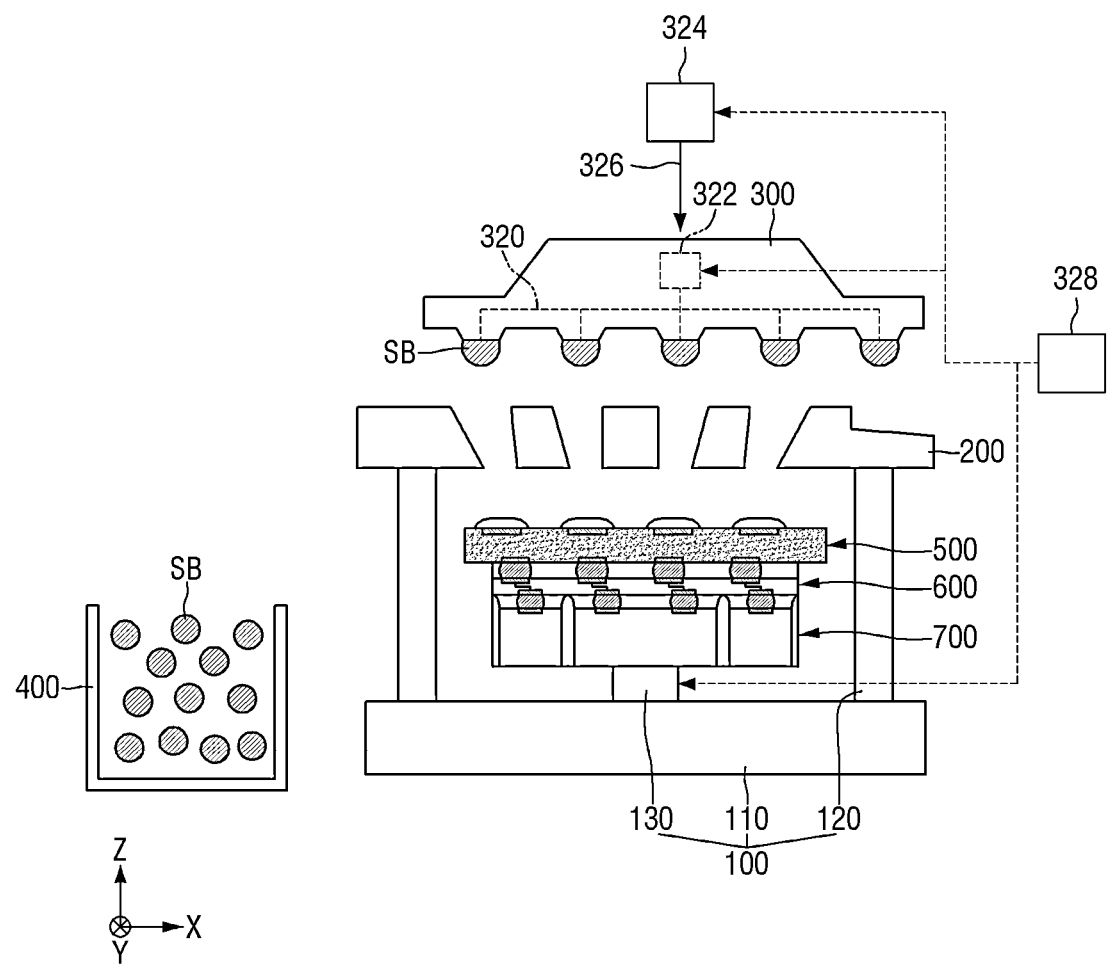

Referring to FIG. 16, the mounting unit 300 may be positioned on the solder ball mask 200. The solder balls SB held by the mounting unit 300 may respectively correspond, in a one-to-one manner, to the through-holes 210 and the discharging grooves 220 of the solder ball mask 200. Some of the solder balls SB held by the mounting unit 300 may respectively correspond to the through-holes 210 (e.g., at least partially overlap in the third direction Z with the second openings 210b thereof), and others of the solder ball SB held by the mounting unit 300 may respectively correspond to the discharging grooves 220.

Figure 17:
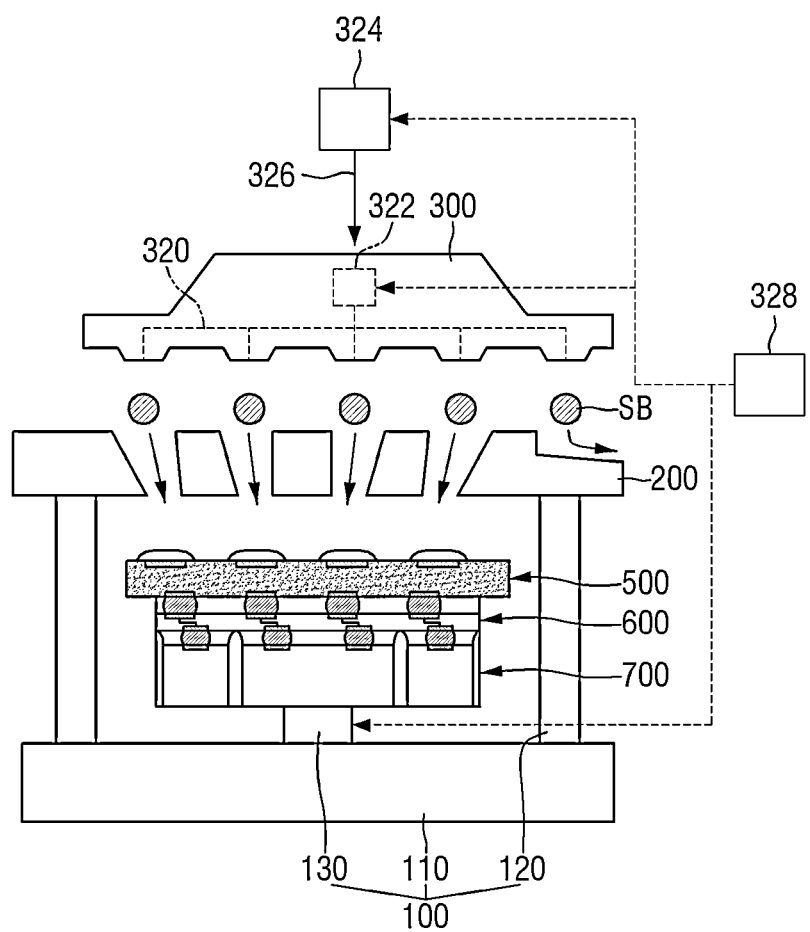

Referring to FIG. 13 and FIG. 17, the mounting unit 300 may mount (e.g., place) the solder balls SB on the substrate 500. The solder balls SB may be aligned with the substrate 500 using the solder ball mask 200 in S300. Accordingly, the solder ball mask 200, and an apparatus including same, may be configured to improve the alignment (e.g., positioning, mounting, etc.) of solder balls SB on a semiconductor package, substrate 500, or the like, even though a pitch between solder balls on the mounting unit 300 may be different being an intended pitch between the positions to which the solder balls SB are to be mounted on the substrate 500, based on the apparatus being configured to cause solder balls SB to move from the mounting unit 300 and through separate, respective through-holes 210 of the solder ball mask 200 to be positioned (e.g., mounted) on the substrate 500, for example to be positioned (e.g., mounted) on the substrate 500 at separate, respective particular locations that may have different relative positions in relation to each other in comparison to the relative positions at which the mounting unit 300 holds solder balls SB (e.g., at the respective first openings 320a of the suctioning units 320) based on the relative positions, shapes, and the like of the through-holes 210 of the solder ball mask 200 through which the solder balls SB move from the mounting unit 300 to the substrate 500, thereby enabling improved alignment of the mounting of solder balls SB. The positions of the solder balls SB on the substrate 500 may be based on the through-holes 210 of the solder ball mask 200 that the solder balls SB move through to be mounted on the substrate 500, and thus the shape and/or positioning of the through-holes 210 in the solder ball mask 200 may enable improved accuracy and/or precision of the positioning and/or alignment of solder balls SB mounted on the substrate 500 with respect to particular portions of the substrate 500 (e.g., first substrate pads 502), even though the relative positioning (e.g., pitch) of solder balls SB on the substrate 500 may be different from the relative positioning (e.g., pitch) of solder balls SB held by the mounting unit 300. As a result of enabling such improved alignment of solder balls SB, for example improved alignment of the mounting of solder balls SB on a substrate 500, the apparatus according to some example embodiments may be configured to enable the formation of devices (e.g., semiconductor packages, semiconductor devices, electronic devices, or the like including the substrate 500) having improved efficiency, performance, reliability or the like, for example due to the substrate 500 having the solder balls SB mounted thereon due to operation of the apparatus having a reduced likelihood of mis-alignment of the solder bolls SB mounted (e.g., placed) thereon and thus a reduced likelihood of defects due to such mis-alignments.

Some of the solder balls SB may respectively pass through the through-holes 210 of the solder ball mask 200 and be mounted on the substrate 500. Others of the solder balls SB may pass through the discharging groove 220 and may be discharged out of (e.g., away from) the substrate 500 so as to not be mounted (e.g., placed) on the substrate 500.

Figure 18:
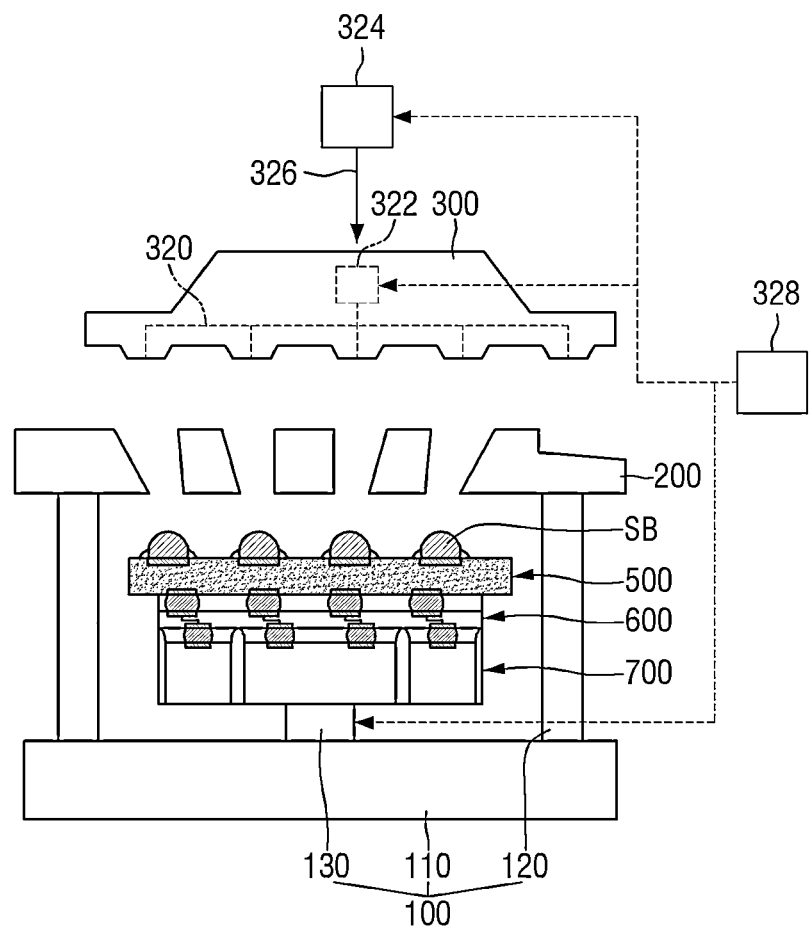

Referring to FIG. 18, the solder balls SB may be aligned with (e.g., mounted on particular, respective portions of) the substrate 500. The solder balls SB may be electrically connected to the first substrate pad 502 in the substrate 500. The substrate 500 and the main board may be electrically connected to each other via the solder balls SB.

In concluding the detailed description, those skilled in the art will appreciate that many variations and modifications may be made to the some example embodiments without substantially departing from the principles of the present inventive concepts. Therefore, the above-noted example embodiments of the inventive concepts are used in a generic and descriptive sense only and not for purposes of limitation.

What is claimed is:

1. An apparatus for mounting solder balls, the apparatus comprising:
   a stage configured to support a substrate thereon;
   a mounting unit configured to mount the solder balls on the substrate; and
   a solder ball mask between the mounting unit and the substrate, wherein the solder ball mask includes
   a first face facing the substrate, and
   a second face opposite to the first face,
   wherein the solder ball mask has a plurality of inner surfaces extending continuously from the first face to the second face defining a plurality of through-holes, the plurality of through-holes extending through a thickness of the solder ball mask from the second face to the first face, wherein the apparatus is configured to cause the solder balls to move through separate, respective through-holes of the plurality of through-holes,
   wherein each through-hole of the plurality of through-holes includes a first opening defined in the first face, and a second opening defined in the second face,
   wherein a first spacing between adjacent first openings of the plurality of through-holes is different from a second spacing between adjacent second openings of the plurality of through-holes, and
   wherein at least one through-hole of the plurality of through-holes has a first sidewall and a second sidewall opposite to each other and a slope of the first sidewall is different from a slope of the second sidewall such that a center of a first opening corresponding to the at least one through-hole and a center of a second opening corresponding to the at least one through-hole of the plurality of through-holes are not aligned with each other in a vertical direction perpendicular to a plan view of the solder ball mask.

2. The apparatus of claim 1, wherein the first spacing is smaller than the second spacing.

3. The apparatus of claim 1, wherein
the first opening of the each through-hole has a first diameter, and
the second opening of the each through-hole has a second diameter that is different from the first diameter.

4. The apparatus of claim 3, wherein the first diameter is smaller than the second diameter.

5. The apparatus of claim 1, wherein
the solder ball mask includes a discharging groove that is defined by a recess in the second face toward the first face, and
the apparatus is configured to cause at least one solder ball to move through the discharging groove and then to be discharged away from the substrate.

6. The apparatus of claim 5, wherein the discharging groove does not extend to the first face.

7. The apparatus of claim 1, wherein
the mounting unit includes a suction source configured to generate a negative pressure and suctioning units in fluid communication with the suction source and configured suck air through respective openings thereof based on the negative pressure generated by the suction source, and
the suctioning units are configured to suction and hold the solder balls in place in relation to the mounting unit based on based on sucking air.

8. The apparatus of claim 1, wherein a spacing between the first sidewall and the second sidewall gradually decreases as each of the plurality of through-holes extends in a direction extending perpendicularly from the second face toward the first face.

9. An apparatus for mounting solder balls, the apparatus comprising:
a stage configured to support a substrate thereon;
solder ball providing units adjacent to the stage, the solder ball providing units configured to provide the solder balls;
a mounting unit configured to
move onto the solder ball providing units,
pick up the solder balls in the solder ball providing units,
move onto the substrate, and
place the solder balls onto the substrate; and
a solder ball mask between the mounting unit and the substrate, the solder ball mask including a first face facing the substrate and a second face opposite to the first face,
wherein the solder ball mask has a plurality of inner surfaces extending continuously from the first face to the second face defining a plurality of through-holes extending through an entirety of a thickness of the solder ball mask,
wherein the apparatus is configured to cause the mounting unit to place the solder balls onto the substrate such that the solder balls move from the mounting unit and further move through separate, respective through-holes of the plurality of through-holes to be placed on the substrate,
wherein each through-hole of the plurality of through-holes has a first opening and a second opening opposite to each other, and
wherein at least one through-hole of the plurality of through-holes has a first sidewall and a second sidewall opposite to each other and a slope of the first sidewall is different from a slope of the second sidewall such that a center of a first opening corresponding to the at least one through-hole and a center of a second opening corresponding to the at least one through-hole of the plurality of through-holes are not aligned with each other in a vertical direction perpendicular to a plan view of the solder ball mask.

10. The apparatus of claim 9, wherein
the first opening of the each through-hole has a first diameter, and
the second opening of the each through-hole has a second diameter that is different from the first diameter.

11. The apparatus of claim 10, wherein the first diameter is smaller than the second diameter.

12. The apparatus of claim 9, wherein
the solder ball mask includes a discharging groove that is defined by a recess in the second face toward the first face,
the apparatus is configured to cause at least one solder ball to move through the discharging groove and then to be discharged away from the substrate, and
the discharging groove does not extend through the entirety of the thickness of the solder ball mask.

13. The apparatus of claim 9, wherein
the mounting unit includes a suction source configured to generate a negative pressure and suctioning units in fluid communication with the suction source and configured suck air through respective openings thereof based on the negative pressure generated by the suction source, and
the suctioning units are configured to suction and hold the solder balls in place in relation to the mounting unit based on based on sucking air.

14. The apparatus of claim 9, wherein a spacing between the first sidewall and the second sidewall gradually decreases as each of the plurality of through-holes extends away from the mounting unit.

15. An apparatus for mounting solder balls, the apparatus comprising:
a stage configured to support a substrate thereon;
solder ball providing units adjacent to the stage, the solder ball providing units configured to provide the solder balls;
a mounting unit configured to
move onto the solder ball providing units,
pick up the solder balls in the solder ball providing units,
move onto the substrate, and
place the solder balls onto the substrate; and
a solder ball mask between the mounting unit and the substrate, wherein the solder ball mask includes a first face facing the substrate, and a second face opposite to the first face,
wherein the solder ball mask has a plurality of inner surfaces extending continuously from the first face to the second face defining a plurality of through-holes and one or more surfaces at least partially defining a discharging groove therein,
wherein the apparatus is configured to cause the mounting unit to place the solder balls onto the substrate such that the solder balls move from the mounting unit and further move through separate, respective through-holes of the plurality of through-holes to be placed on the substrate, wherein the apparatus is configured to cause at least one solder ball to move through the discharging groove and to be discharged out of the substrate, wherein each through-hole of the plurality of through-holes extends from the second face to the first face, and the discharging groove is recessed in the second face but does not extend to the first face, wherein the each through-hole of the plurality of through-holes has a first opening defined in the first face, a second opening defined in the second face, and a first sidewall and a second sidewall opposing each other, wherein a first spacing between adjacent first openings of the plurality of through-holes is smaller than a second spacing between adjacent second openings of the plurality of through-holes, wherein, in the each through-hole of the plurality of through-holes, a spacing between the first sidewall of the each through-hole and the second sidewall of the each through-hole gradually decreases as the each through-hole extends in a direction extending perpendicularly from the second face toward the first face, and wherein at least one through-hole of the plurality of through-holes has a first sidewall corresponding to the at least one through-hole and a second sidewall corresponding to the at least one through-hole opposite to each other and a slope of the first sidewall corresponding to the at least one through-hole is different from a slope of the second sidewall corresponding to the at least one through-hole such that a center of a first opening corresponding to the at least one through-hole and a center of a second opening corresponding to the at least one through-hole are not aligned with each other in a vertical direction perpendicular to a plan view of the solder ball mask.

16. The apparatus of claim 15, wherein the mounting unit includes a suction source configured to generate a negative pressure and suctioning units in fluid communication with the suction source and configured suck air through respective openings thereof based on the negative pressure generated by the suction source, and the suctioning units are configured to suction and hold the solder balls in place in relation to the mounting unit based on based on sucking air.

17. The apparatus of claim 15, wherein the first opening of the each through-hole has a first diameter, and the second opening of the each through-hole has a second diameter that is larger than the first diameter.

* * * * *